United States Patent
Roewer et al.

(10) Patent No.: US 7,663,965 B2
(45) Date of Patent: Feb. 16, 2010

(54) MEMORY WITH CLOCK-CONTROLLED MEMORY ACCESS AND METHOD OF OPERATING THE SAME

(75) Inventors: Falk Roewer, Ottobrunn (DE); Florian Schnabel, Höhenkirchen (DE); Christian Sichert, München (DE)

(73) Assignee: Qimonda AG, Munich (DE)

( * ) Notice: Subject to any disclaimer, the term of this patent is extended or adjusted under 35 U.S.C. 154(b) by 305 days.

(21) Appl. No.: 11/761,004

(22) Filed: Jun. 11, 2007

(65) Prior Publication Data

US 2007/0291554 A1    Dec. 20, 2007

(30) Foreign Application Priority Data

Jun. 9, 2006   (DE)   ............ 10 2006 026 970

(51) Int. Cl.
*G11C 8/00*    (2006.01)
(52) U.S. Cl. .................. 365/233.1; 365/189.05
(58) Field of Classification Search .......... 365/233.1, 365/189.05
See application file for complete search history.

(56) References Cited

U.S. PATENT DOCUMENTS

| | | | |
|---|---|---|---|
| 6,512,719 B2 | 1/2003 | Fujisawa et al. | |
| 7,362,619 B2 * | 4/2008 | Morzano et al. | 365/189.05 |
| 7,370,140 B2 * | 5/2008 | Sartore et al. | 711/105 |
| 7,376,021 B2 * | 5/2008 | Heo et al. | 365/189.05 |
| 2003/0223300 A1 | 12/2003 | Schroder et al. | |

* cited by examiner

*Primary Examiner*—Hoai V Ho
*Assistant Examiner*—Fernando N Hidalgo
(74) *Attorney, Agent, or Firm*—Edell, Shapiro & Finnan, LLC

(57) ABSTRACT

An integrated circuit memory with clock-controlled memory access includes at least one data connection to input/output data, a memory cell array including memory cells to store data, a clock generator circuit to generate a clock signal, a memory circuit to store data, a control circuit to control storage of data in the memory circuit and to control output of data from the memory circuit. The memory circuit is connected to the memory cell array and to the at least one data connection. During read access to the memory cells, first and second data supplied to the memory circuit from the memory cell array are buffer-stored in the memory circuit upon first and second edges of the clock signal. The first and second data are output from the memory circuit and supplied to the at least one data connection upon third and fourth edges of the clock signal.

18 Claims, 12 Drawing Sheets

| Data 0<0> |
| Data 2<0> |
| Data 0<1> |
| Data 2<1> |
| Data 0<2> |
| Data 2<2> |
| Data 0<3> |
| Data 2<3> |

⋮

| Data 0<15> |
| Data 2<15> |

| Data 1<0> |
| Data 3<0> |
| Data 1<1> |
| Data 3<1> |
| Data 1<2> |
| Data 3<2> |
| Data 1<3> |
| Data 3<3> |

⋮

| Data 1<15> |
| Data 3<15> |

MEMORY WITH CLOCK-CONTROLLED
MEMORY ACCESS AND METHOD OF
OPERATING THE SAME

CROSS REFERENCE TO RELATED APPLICATIONS

This application claims priority under 35 U.S.C. §119 to Application No. DE 102006026970.5 filed on Jun. 9, 2006, entitled "Integrated Semiconductor Memory with Clock-Controlled Memory Access," the entire contents of which are hereby incorporated by reference.

BACKGROUND

An integrated circuit memory, for example, a DRAM (Dynamic Random Access Memory) semiconductor memory, generally comprises a plurality of memory cell arrays or memory banks in which memory cells are arranged in matrix fashion along word lines and bit lines. Access to a memory cell involves an address associated with the memory cell being first of all applied to the integrated circuit memory. A word line driver is then used to feed a control voltage onto the word line to which the addressed memory cell is connected. In the case of a DRAM store, this turns on a selection transistor for the addressed memory cell, so that a storage capacitor in the memory cell is conductively connected to the bit line connected to the memory cell. The bit line can be used to store data in the addressed memory cell or to read data from the addressed memory cell on the basis of write or read access.

SUMMARY

An integrated circuit memory with clock-controlled memory access is described herein. The integrated circuit memory comprises at least one data connection to input/output data, a memory cell array comprising memory cells to store data, a clock generator circuit to generate a clock signal, a memory circuit to store data, a control circuit to control storage of data in the memory circuit and to control output of data from the memory circuit. The memory circuit is connected to the memory cell array and to the at least one data connection. During read access to the memory cells, first and second data supplied to the memory circuit from the memory cell array are buffer-stored in the memory circuit upon first and second edges of the clock signal. The first and second data are output from the memory circuit and supplied to the at least one data connection upon third and fourth edges of the clock signal.

The above and still further features and advantages of the present invention will become apparent upon consideration of the following definitions, descriptions and descriptive figures of specific embodiments thereof, wherein like reference numerals in the various figures are utilized to designate like components. While these descriptions go into specific details of the invention, it should be understood that variations may and do exist and would be apparent to those skilled in the art based on the descriptions herein.

BRIEF DESCRIPTION OF THE DRAWINGS

The memory and the method are explained in more detail below with reference to accompanying drawings, where.

DETAILED DESCRIPTION

In the following detailed description, exemplary embodiments of an integrated circuit memory and method of operating the same are described in connection with the figures.

Figure 1:
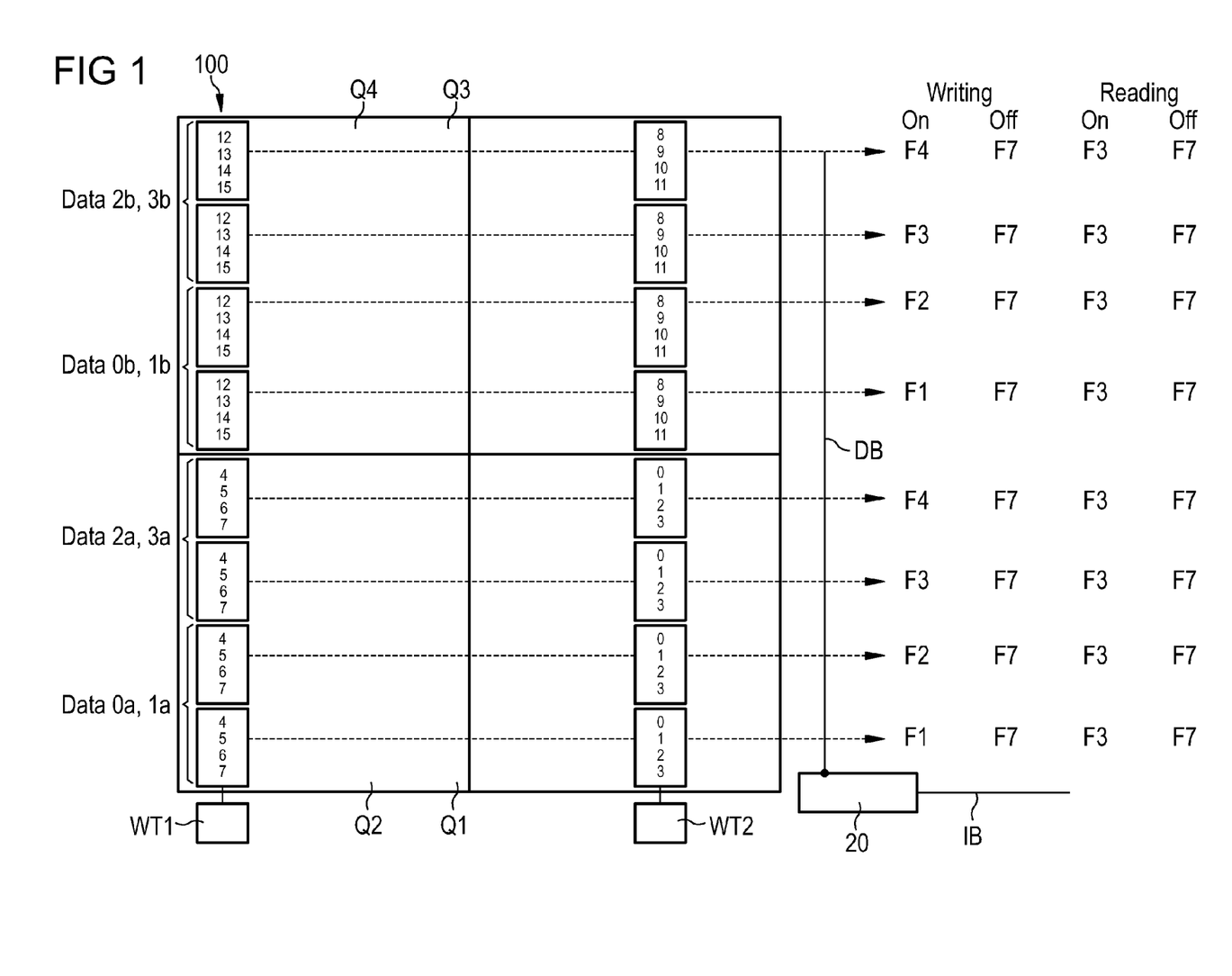
FIG. 1 shows write and read access to a memory cell array in an integrated circuit memory wherein the array is connected via a bus to a memory circuit for writing and reading data.

FIG. 1 shows a memory bank 100 which is divided into four areas Q1, Q2, Q3 and Q4. Each of the areas comprise memory cells which are arranged along word lines and bit lines. For clarity, the word lines and bit lines are not shown in FIG. 1.

For data input and output, the semiconductor memory shown in FIG. 1 comprises 16 data connections DQ0, . . . , DQ15 which are connected to a memory circuit 20 via a bus IB. Write access involves the data which have been applied to the data connections DQ0, . . . , DQ15 being first of all forwarded to the memory circuit 20 and buffer-stored in the memory circuit 20 before they are supplied to the memory cell array 100 for storage in the memory cells. To this end, the memory circuit 20 is connected to the data connections via a bus IB and to the memory cell array via a data bus DB. In the case of a DDR (Double Data Rate) II DRAM, the bus IB is in the form of a 16-bit parallel bus, for example, whereas the data bus DB is in the form of a 64-bit parallel bus. From a main path (running vertically in FIG. 1) of the data bus DB, the lines of the data bus branch and lead to memory cells in the individual areas of the memory bank 100.

Write access involves, for example, data which are applied to the data connections DQ0, DQ1, DQ2 and DQ3 being stored in memory cells 0, 1, 2, and 3 which are arranged in the area Q1 of the memory bank 100. Data which are applied to the data connections DQ4, DQ5, DQ6 and DQ7 are stored in memory cells 4, 5, 6 and 7, which are arranged in the area Q2, via the data bus DB. Data which are applied to the data connections DQ8, DQ9, DQ10 and DQ11 or to the data connections DQ12, DQ13, DQ14 and DQ15 are stored, via the data bus, in memory cells 8, 9, 10 and 11 in the area Q3 or in memory cells 12, 13, 14 and 15 in the area Q4 of the memory cell array 100.

In line with the write access, read access involves data from the memory cells 0, 1, 2, 3 in the area Q1 being supplied via the data bus DB, the memory circuit 20 and the bus IB to the data connections DQ1, DQ2 and DQ3. Data from the memory cells 4, 5, 6 and 7 from the area Q2 are supplied to the data connections DQ4, DQ5, DQ6 and DQ7, data from the memory cells 8, 9, 10 and 11 from the area Q3 are supplied to the data connections DQ8, DQ9, DQ10 and DQ11, and data which have been stored in memory cells 12, 13, 14 and 15 in the area Q4 are supplied to the data connections DQ12, DQ13, DQ14 and DQ15.

Figure 2:
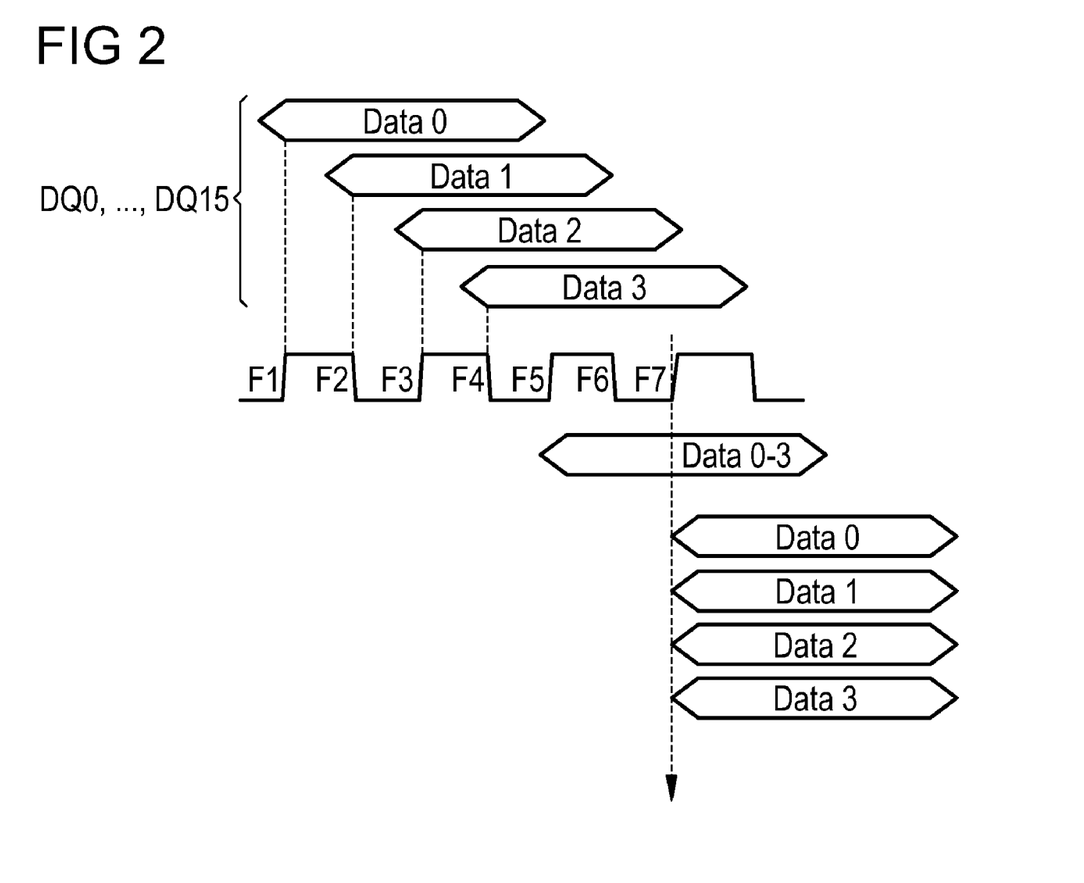
FIG. 2 shows a timing diagram for the writing of data packets to a memory cell array.

FIG. 2 shows a timing diagram for data streams Data0, Data1, Data2 and Data3 which are stored in memory cells in the four areas of the memory bank 100. In this case, the data stream Data0 comprises data packets Data0a and Data0b. The data stream Data1 comprises the data packets Data1a and Data1b. The data stream Data2 contains the data packets Data2a and Data2b, and the data stream Data3 comprises the data packets Data3a and Data3b. The data packets Data0a, Data1a, Data2a and Data3a respectively comprise data D0, . . . , D7 which are applied to the data connections DQ0, . . . , DQ7. The data packets Data0b, Data1b, Data2b and Data3b comprise data which are applied to the data connections DQ8, . . . , DQ15.

Writing to the memory cell array involves data D0, . . . , D15 being first of all applied to the data connections DQ0, . . . , DQ15. These are received by receiver circuits R0, . . . , R15 connected to the data connections and are fed onto the bus IB upon a rising edge F1 of a clock signal CLK. The bus IB is, as explained above, a narrow bus containing 16 lines, for example, via which the data D0, . . . , D15 are routed as data packets Data0a and Data0b to the memory circuit 20.

When the data packets Data0a and Data0b have been applied, the data packet Data1a comprising data D0, . . . , D7 is subsequently applied to the data connections DQ0, . . . , DQ7, and the data packet Data1b comprising the data D7, . . . , D15 is applied to the data connections DQ7, . . . , DQ15. Upon a subsequent falling edge F2 of the clock signal CLK, these data packets are supplied to the memory circuit 20 via the lines of the bus IB. Similarly, the data packets Data2a, Data2b and Data3a, Data3b are subsequently applied to the data connections of the integrated semiconductor memory and are supplied to the memory circuit 20 via the bus IB as data streams Data2 and Data3 upon the edges F3 and F4 of the clock signal CLK.

The data streams Data0, Data1, Data2 and Data3 which have been transmitted via the bus IB upon different edges and hence have arrived at the memory circuit 20 at different times are buffer-stored in the memory circuit 20 and are output onto the 64 lines of the data bus DB upon a common edge of the clock signal CLK, in the example in FIG. 2 the edge F7. The data packet Data0a, which comprises the data D0, . . . , D7 and has been transmitted via the bus IB upon the edge of one of the clock signals CLK, is stored in the memory cells 0, 1, 2 and 3 in the area Q1 or in the memory cells 4, 5, 6 and 7 in the area Q2. The data D8, . . . , D11 in the data packet Data0b, which has likewise been transmitted via the bus IB upon the edge F1 of the clock signal CLK, are stored in the memory cells 8, 9, 10 and 11 in the area Q3, and the data D12, . . . , D15 in the data packet Data0b are stored in the memory cells 12, 13, 14 and 15 in the area Q4. Accordingly, the remaining data packets Data1a and Data1b, which have been transmitted to the memory circuit 20 via the bus IB upon the edge F2 of the clock signal CLK, the data packets Data2a and Data2b, which have been supplied to the memory circuit 20 via the bus IB upon the edge F3 of the clock signal CLK, and the data packets Data3a and Data3b, which have been supplied to the memory circuit 20 upon the edge F4 of the clock signal CLK, are stored in the areas of the memory bank 100 which are shown in FIG. 1.

The memory circuit 20 thus feeds all data packets Data0a, Data0b, . . . , Data3a, Data3b onto the data bus DB upon a common edge of the clock signal CLK, and from the data bus DB they are stored in the relevant areas of the memory cell array 100. The data packets are transmitted via the data bus DB asynchronously.

A write operation to the memory cell array 100 involves the memory cells which are arranged close to an associated word line driver WT being turned off first at the end of a write operation, since the change in the control voltage on the word line takes effect close to the respective word line driver first. Since the data packets Data0a, Data0b, . . . , Data3a, Data3b are fed onto the data bus DB together, the problem arises that memory cells which are situated close to the respective word line driver have a time critical response to a write operation when the data supplied to them have not yet been stored in full and the selection transistors for these memory cells are turned off again as a result of the change in the control voltage taking effect on the word line.

Figure 3:
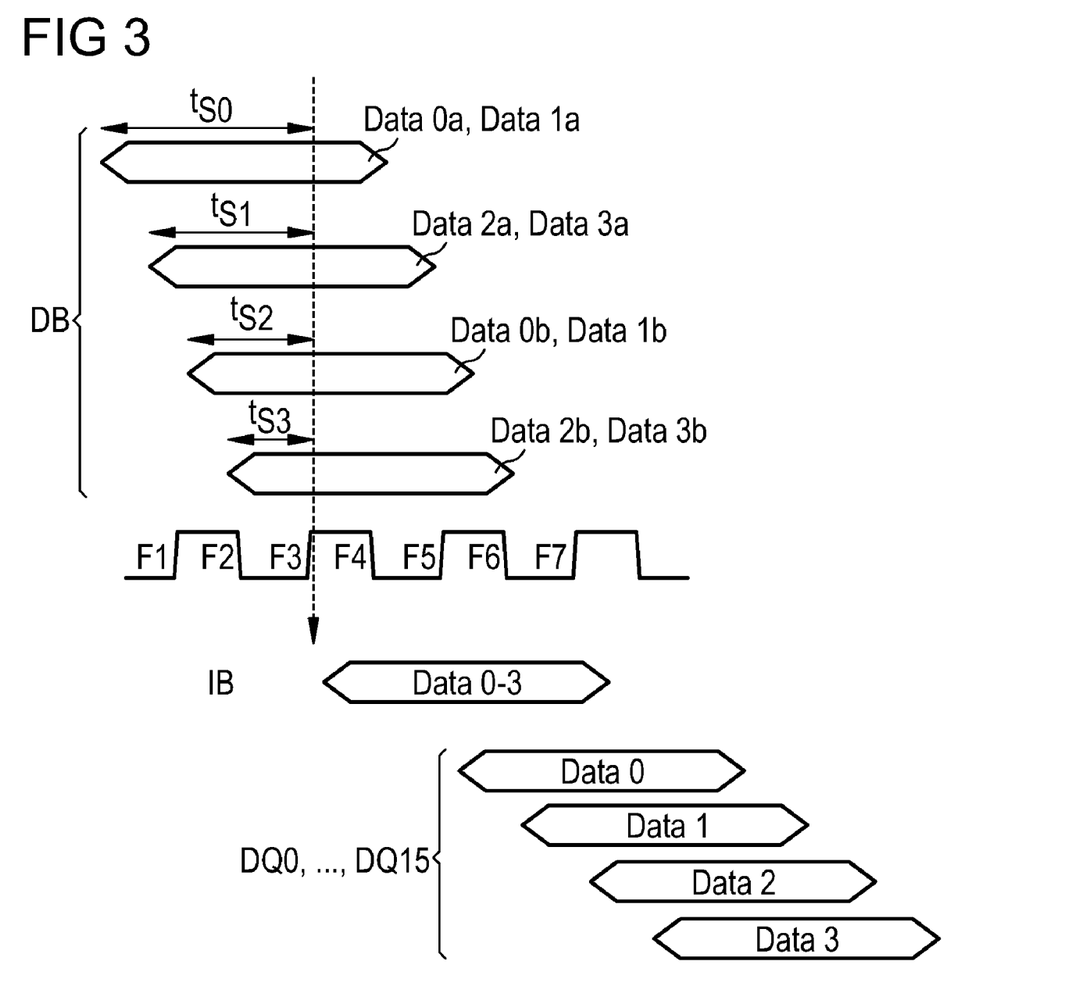
FIG. 3 shows a timing diagram for the reading of data packets from a memory cell array.

FIG. 3 shows read access to the memory cells in the memory cell array 100. Read access involves data which have been read from memory cells 0, . . . , 3 in the area Q1, memory cells 4, . . . , 7 in the area Q2, memory cells 8, . . . , 11 in the area Q3 and memory cells 12, . . . , 15 in the area Q4 being output on the data connections DQ0, . . . , DQ15. Following activation of a common word line in the areas Q1 and Q3 and of a common word line in the areas Q2 and Q4, the data in the data packet Data0a from the memory cells 0, . . . , 3 in the area Q1 and from the memory cells 4, . . . , 7 in the area Q2 and also the data packet Data1a containing data which have been stored in the memory cells 0, . . . , 3 in the area Q1 and in the memory cells 4, . . . , 7 in the area Q2 are applied to the memory circuit 20 first. Next, the data packets Data2a and Data3a which have likewise been stored in the memory areas Q1 and Q2 are applied to the memory circuit 20. Finally, the data packets Data0b, Data1b and Data2b, Data3B which are stored in memory areas which are further away from the memory circuit 20 arrive on the memory circuit 20.

The applied data, in the example in FIGS. 1 and 3 a total of 64 data items on the 64-bit data bus DB, are stored in the memory circuit 20 upon a common edge F3 of the clock signal CLK. The data are then successively output sequentially onto the 16-bit bus IB as data streams Data0, . . . , Data3 and appear on the data connections DQ0, . . . , DQ15 staggered over time upon the edges F4, F5, F6 and F7.

As can be seen from FIG. 3, the data packets which are read from the memory cell array are applied to the memory circuit 20 for different lengths of time before being buffer-stored in the memory circuit 20. The data packets Data0a, Data1a which arrive on the memory circuit 20 earliest are applied to the memory circuit 20 for the longest with a setup time $t_{s0}$. The data packets Data2a, Data3a are applied to the memory circuit 20 with a setup time $t_{s1}$, the data packets Data0b, Data1b are applied to the memory circuit 20 with a setup time $t_{s2}$, and the data Data2b, Data3b arriving on the memory circuit 20 last on account of the long data path are applied to the memory circuit 20 with a relatively short setup time $t_{s3}$ before being buffer-stored in the memory circuit 20.

A read operation, as shown in FIG. 3, involves the data which actually arrive on the memory circuit 20 early being buffer-stored only when the data from the other areas of the memory cell array and hence also data packets which arrive on the memory circuit 20 much later have been applied. This causes a long latency for a read operation.

Figure 4:
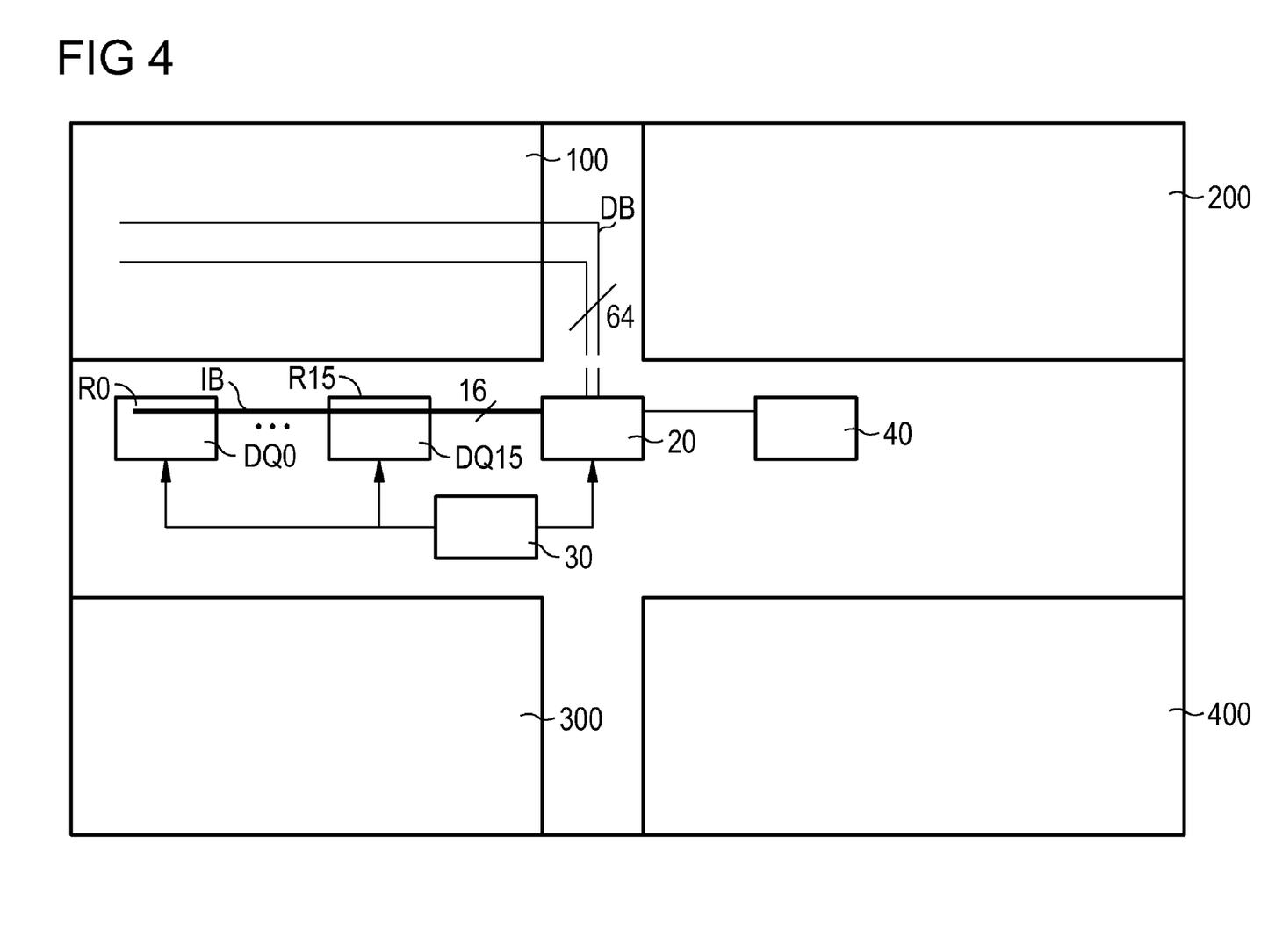
FIG. 4 shows an embodiment of an integrated circuit memory including a plurality of memory banks.

FIG. 4 shows an integrated semiconductor memory comprising four memory banks 100, 200, 300 and 400. For applying data which are intended to be written to memory cells in a memory bank, or for outputting data which are read from memory cells in a memory bank, the semiconductor memory has a plurality of data connections DQ0, . . . , DQ15. Each of the data connections is connected to a receiver circuit R0, . . . , R15 for receiving or for outputting the data. The receiver circuits are connected to a memory circuit 20, (e.g., a latch), via a bus IB, which in the example in FIG. 4 is in the form of a 16-bit bus comprising 16 lines.

The memory circuit 20 is connected to the individual memory banks via a wide parallel data bus DB. For reasons of better clarity, FIG. 4 shows only one connection between the memory circuit 20 and the memory bank 100 via the data bus DB. The data bus DB is in the form of a 64-bit bus comprising a total of 64 lines. The storage of data in the memory circuit 20 and the output of the stored data onto the data bus DB and onto the bus IB are controlled by a control circuit 40.

In addition, the receiver circuits R0, . . . , R15 and the memory circuit 20 are connected to a clock generator circuit 30 for generating a clock signal CLK. Under the clocking of the clock signal CLK, the receiver circuits feed the data received from the data connections onto the bus IB or supply the data received from the bus IB to the data connections DQ0, . . . , DQ15 in sync with the clock signal CLK. The storage of data in the memory circuit 20 or the output data from the memory circuit 20 likewise takes place in sync with the clock signal CLK.

Figure 5:
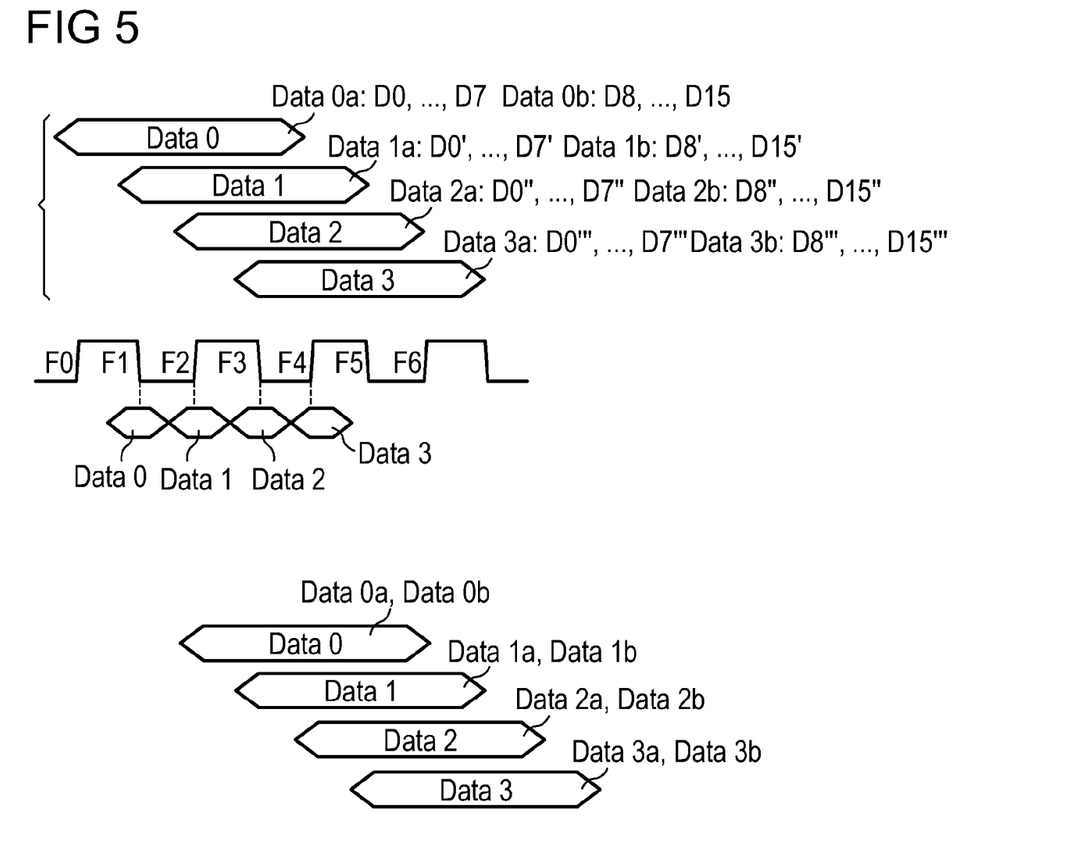
FIG. 5 shows a timing diagram for the writing of data to memory cells in a memory cell array.
Figure 6:
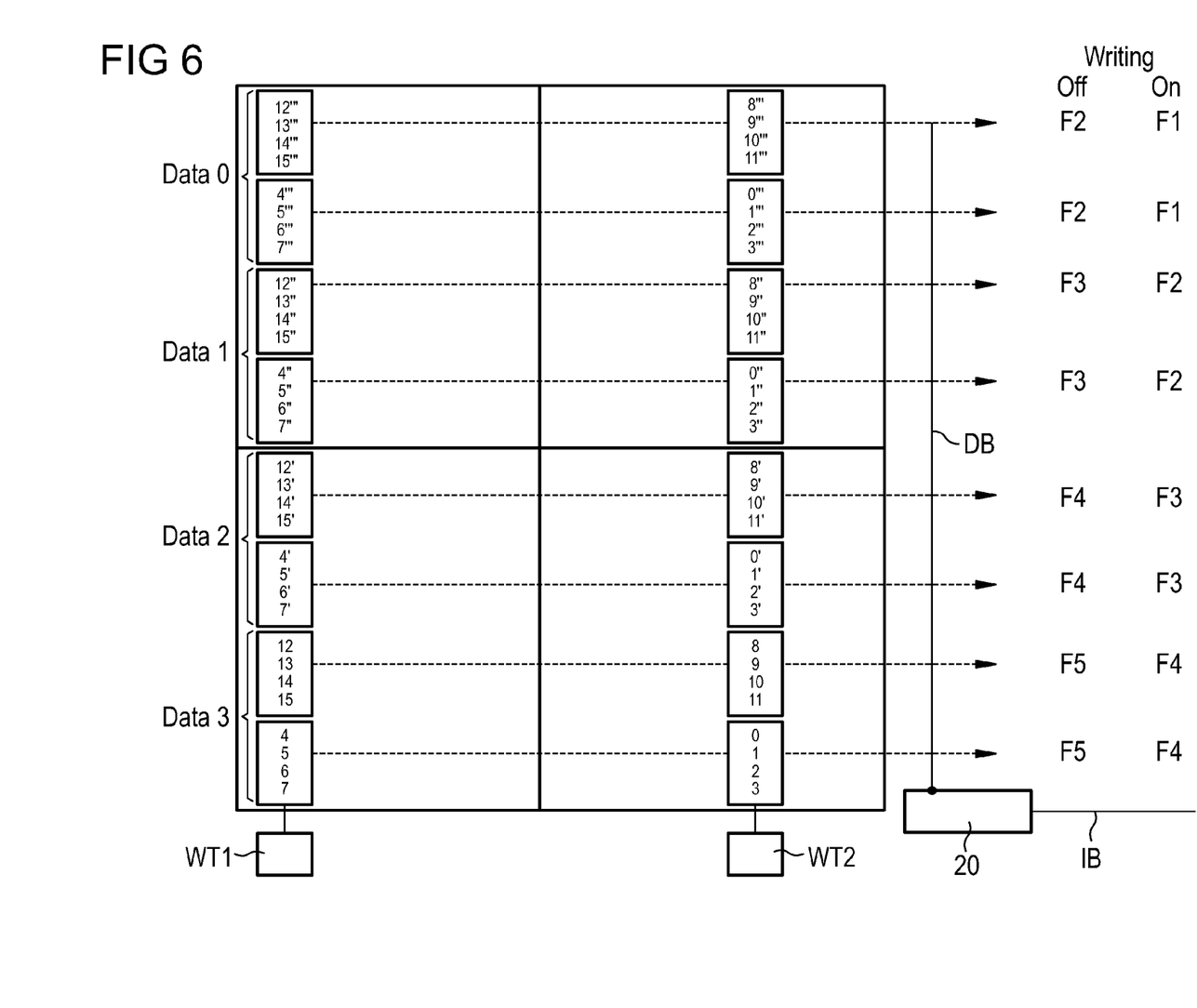
FIG. 6 shows write access to a memory cell array in an integrated circuit memory wherein the array is connected via a bus to a memory circuit for writing and reading data.

The text below describes write access to the memory cells in the memory cell array 100 with reference to FIGS. 5 and 6. FIG. 5 shows a timing diagram for the writing of data packets to the memory cells in the memory cell array 100. FIG. 6 shows the memory bank 100 with the areas Q1, Q2, Q3 and Q4 containing memory cells which are connected to the data bus DB for the purpose of writing data or for the purpose of reading data. The data bus DB is connected to a memory circuit 20 which in turn is connected to the bus IB.

First, the data packets Data0a containing the data D0, . . . , D7 and Data0b containing the data D8, . . . , D15 are applied to the data connections DQ0, . . . , D15, with the data D0, . . . , D7 in the data packet Data0a being applied to the data connections DQ0, . . . , DQ7 and the data D8, . . . , D15 in the data packet Data0b being applied to the data connections DQ8, . . . , DQ15. The data packets Data0a, Data0b received by the receiver circuits R0, . . . , R15 are fed onto the bus IB as data stream Data0 by the receiver circuits upon an edge F0 of the clock signal CLK. Next, the further data packets Data1a, Data1b, Data2a, Data2b and Data3a, Data3b are applied to the data connections. In this case, the data packets Data1a, Data1b are fed onto the bus IB as data stream Data1 upon the edge F2 of the clock signal CLK. Accordingly, the data packets Data2a, Data2b and Data3a, Data3b are fed onto the bus IB as data stream Data2 and data stream Data3 upon the edge F3 or upon the edge F4 of the clock signal CLK. The data streams are therefore transmitted to the memory circuit 20 on the 16-bit bus IB sequentially.

The data stream Data0 reaches the memory circuit 20 first. Next, the data streams Data1, Data2 and Data3 fed onto the bus IB upon the later edges of the clock signal CLK arrive on the memory circuit 20. In contrast to the embodiment of the integrated semiconductor memory which is shown in FIG. 2, the data streams are fed onto the data bus DB upon different edges of the clock signal CLK in line with their arrival time on the memory circuit 20. Thus, the data Data0a, Data0b in the data stream Data0 which arrive on the memory circuit 20 first are fed onto the data bus upon the edge F2 of the clock signals CLK. The data streams Data1, Data2 and Data3 which arrive next are fed onto the data bus upon the next edges of the clock signal CLK. This prevents data packets which arrive on the memory circuit 20 early from experiencing a long waiting time before they are forwarded to the memory cell array 100 together with data packets which arrive on the memory circuit later.

FIG. 6 shows the association between the individual data streams and areas within the memory bank 100 for a first variant of write access. In line with FIG. 6, the data stream Data0, which has been fed onto the data bus DB upon the edge F2 of the clock signals CLK, is stored in the memory cells 0''', . . . , 15''' in the area Q1 and the area Q2 of the memory cell array 100. The data stream Data1 which is output by the memory circuit 20 upon the edge F3 is stored in the memory cells 0'', . . . , 15'' in the memory areas Q1 and Q2. The data stream Data2 which is fed onto the data bus DB upon the edge F4 is stored in the memory cells 0', . . . , 15' in the memory area Q3 and the memory area Q4 of the memory cell array 100. Finally, the data stream Data3 which is output to the data bus DB by the memory circuit 20 last upon the edge F5 is stored in the memory cells 0, . . . , 15 in the memory areas Q3 and Q4.

Such writing of data streams to memory cells in a memory bank stores those data which are available on the memory circuit 20 first in those memory cells in the memory bank which are furthest away from the memory circuit 20 or from the word line drivers. The data have a long transit time from the memory circuit to those areas of the memory cell array which are a long way from the memory circuit 20. However, since those data which arrive on the memory circuit earliest are written to the areas which are furthest away from the word line drivers, there is the assurance that the data have already been stored reliably before the memory cells are turned off by an appropriate control potential on the word line.

Figure 7:
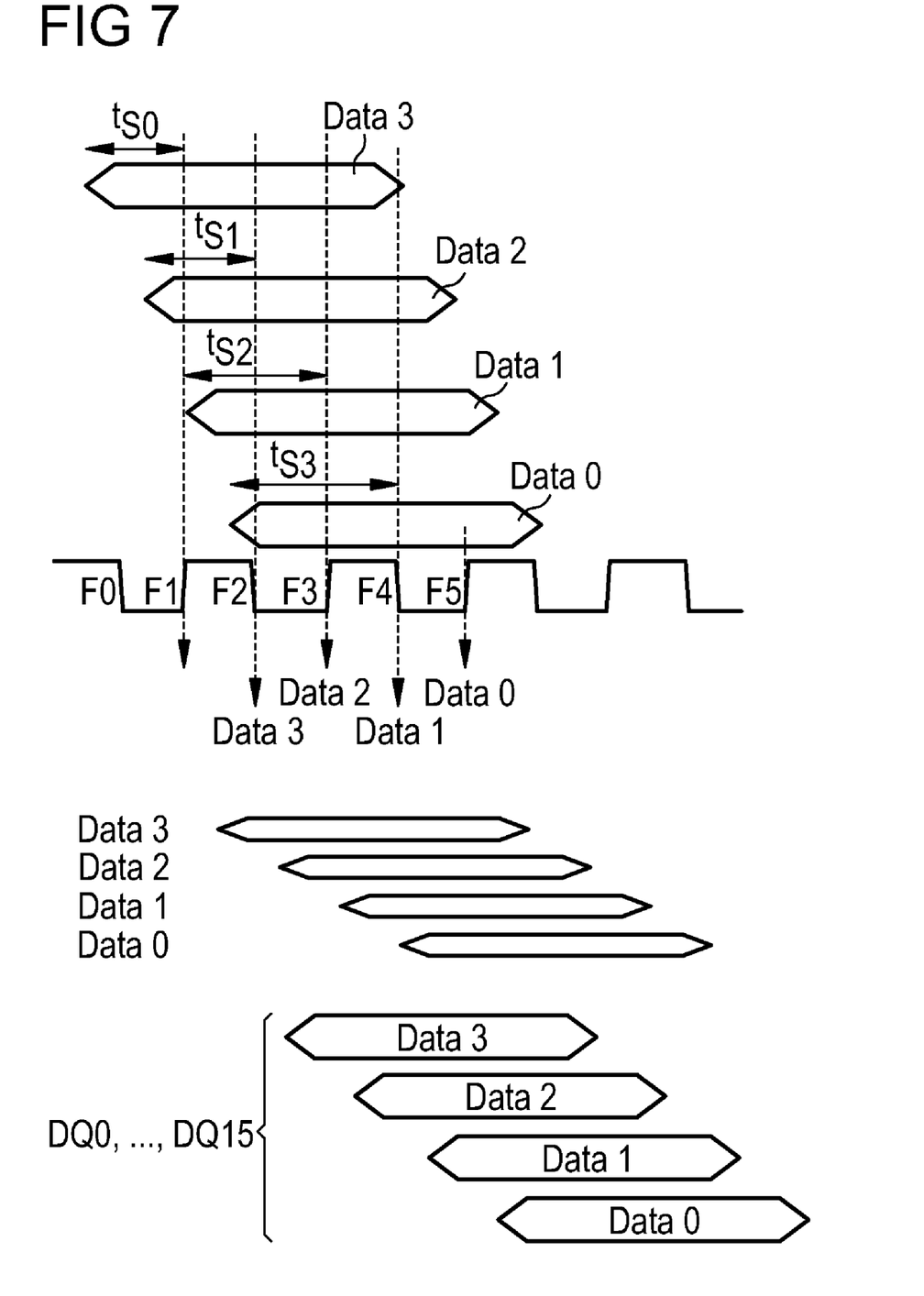
FIG. 7 shows a timing diagram for the reading of data from a memory cell array.
Figure 8:
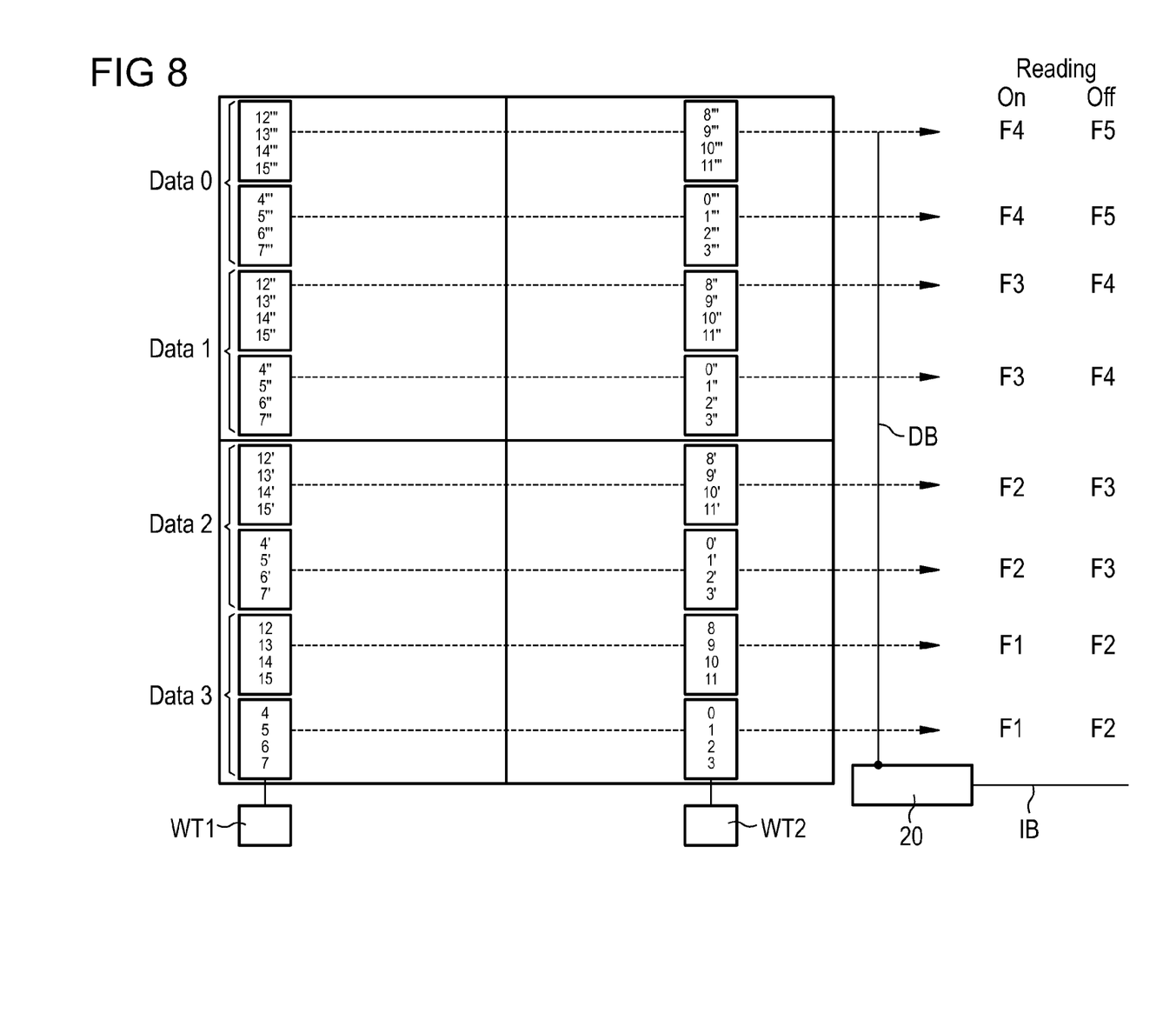
FIG. 8 shows read access to a memory cell array in an integrated circuit memory wherein the array is connected via a bus to a memory circuit for writing and reading data.

Read access is described with reference to FIGS. 7 and 8. FIG. 7 shows a timing diagram for data streams Data0, . . . , Data3 when memory cells in the memory cell array 100 are read. FIG. 8 shows the memory cell array 100 with the data streams Data0, . . . , Data3 which are read upon the edges of the clock signal CLK in FIG. 7. An appropriate control potential on the word line which is connected to the word line driver WT1 or to the word line driver WT2 activates the memory cells connected to the word line for a read operation, therefore, they are conductively connected to the bit line respectively connected to them.

The short data path means that the data stream Data3 is applied to the memory circuit 20 first. Next, the data streams Data2, Data1 and Data0 arrive on the memory circuit 20. The data stream Data3 which arrived first is stored in the memory circuit 20 after a short setup time $t_{s0}$ actually upon the edge F1 of the clock signal CLK. The data stream Data3 is also output onto the bus IB first by the memory circuit 20 upon the edge F2 of the clock signal and supplied to the receiver circuits R0, . . . , R15. Upon the edge F2, the data stream Data2 next arriving on the memory circuit 20 is buffer-stored in the memory circuit 20 and is output onto the bus IB and supplied to the receiver circuits upon the next edge F3. The data stream Data1 is buffer-stored in the memory circuit 20 after a setup time $t_{s2}$ upon the edge F3 and is output onto the bus IB upon the edge F4. The data stream Data0, which is supplied to the memory circuit 20 from the most remote area of the memory cell array, is buffer-stored in the memory circuit 20 after a setup time $t_{s3}$ upon the edge F4 of the clock signal CLK and is output onto the bus IB upon the edge F5.

Read access to memory cells in the memory cell array 100, as shown in FIG. 8, involves the data record applied to the memory circuit 20 first being stored in the memory circuit 20 and also being output again first and supplied to the data connections. It is therefore no longer necessary for the data record applied to the memory circuit 20 first to be read into the memory circuit or output onto the data bus IB only when all the data in the memory cell array have arrived on the memory circuit 20. This speeds up the reading of data from the memory cell array and reduces the latency for reading.

Figure 9:
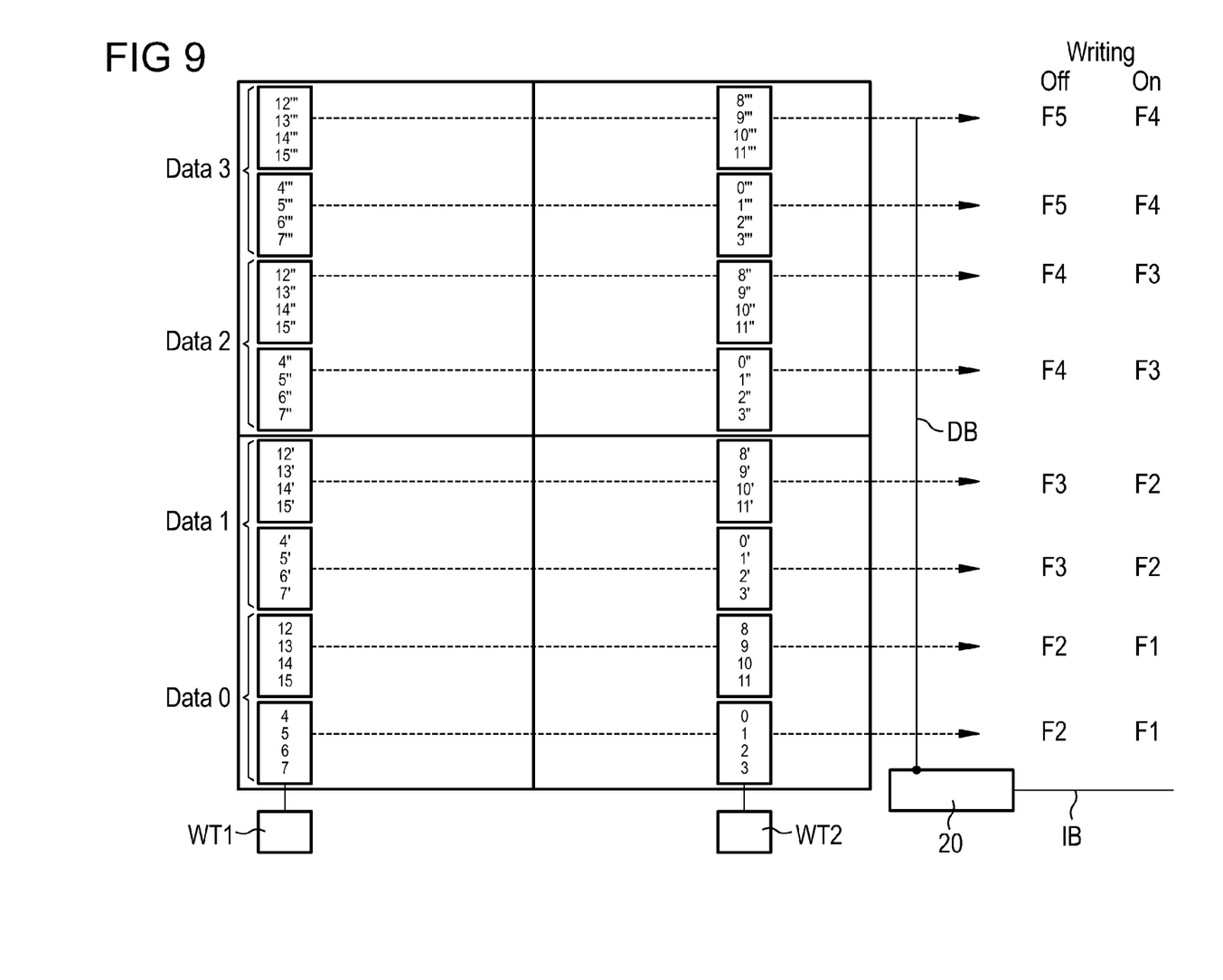
FIG. 9 shows write access to a memory cell array in an integrated circuit memory wherein the array is connected via a bus to a memory circuit for writing and reading data.

FIG. 9 shows a further variant for the writing of data to memory cells in the memory cell array 100. In line with FIG. 9, the data stream Data0, which has been fed onto the data bus DB upon the edge F2 of the clock signals CLK, is stored in the memory cells 0, ..., 15 in the memory areas Q1 and Q2 of the memory cell array. The data in the data stream Data1, which are output onto the data bus DB by the memory circuit 20 upon the edge F3 of the clock signal CLK, are stored in the memory cells 0', ..., 15' in the memory areas Q1 and Q2 of the memory cell array 100. The data stream Data2, which has been output onto the data bus DB by the memory circuit 20 upon the edge F4 of the clock signal CLK, is written to the memory cells 0'', ..., 15'', which are arranged in the areas Q3 and Q4 of the memory cell array. The data in the data stream Data3, which have been output onto the data bus DB as last data upon the edge F5 of the clock signal CLK, are stored in the memory cells 0''', ..., 15''' in the memory areas Q3 and Q4 of the memory cell array 100.

In the embodiment shown in FIG. 9, the storage of data in the memory cells in the memory cell array 100 involves those data which have been output onto the data bus DB first being stored in those memory cells which, on account of their proximity to the word line driver, are deactivated again first by an appropriate control potential on the word line by virtue of their selection transistor being turned off. This ensures that data are safely stored even in those memory cells which are closest to the word line drivers WT.

Figure 10:
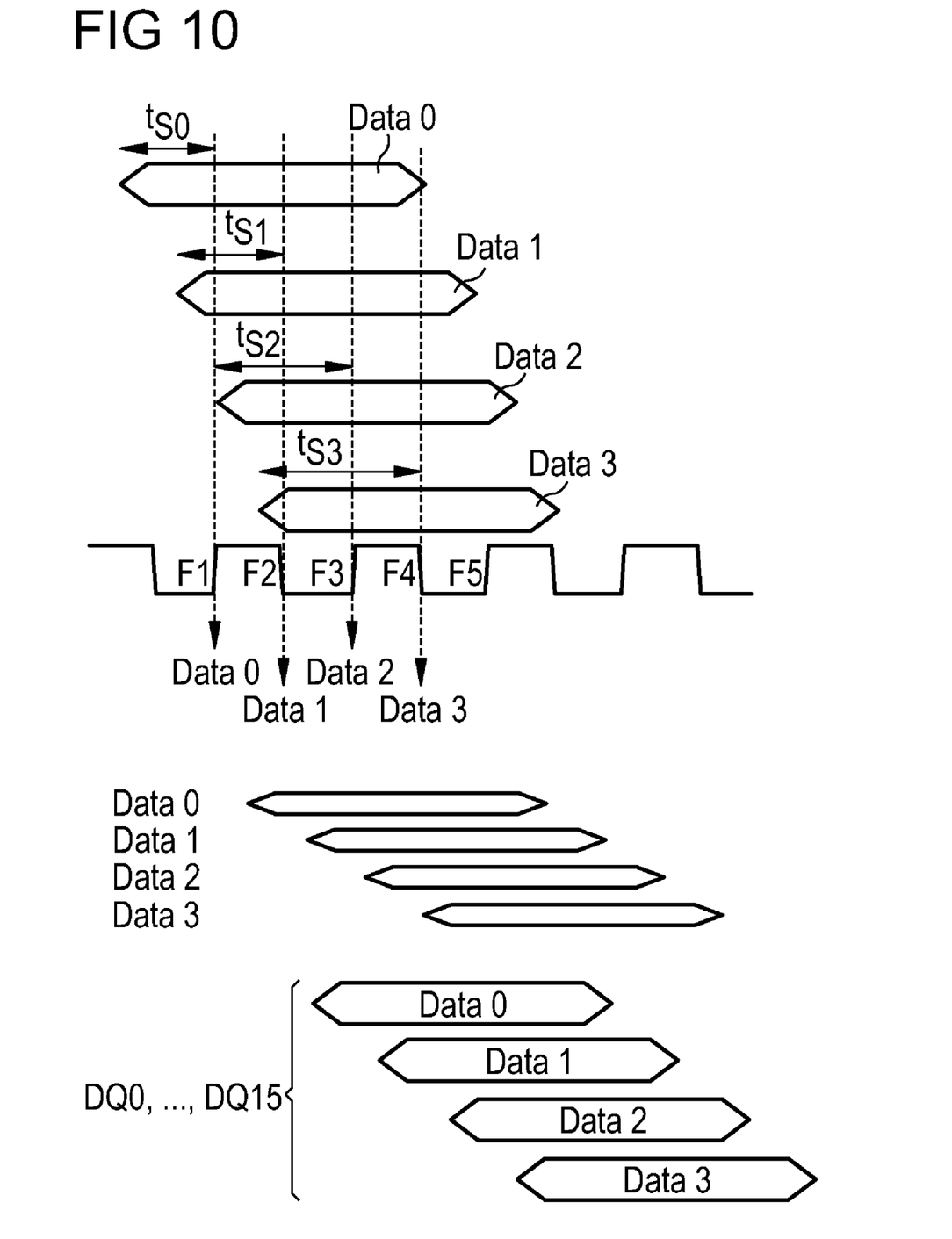
FIG. 10 shows a timing diagram for the reading of data from a memory cell array.
Figure 11:
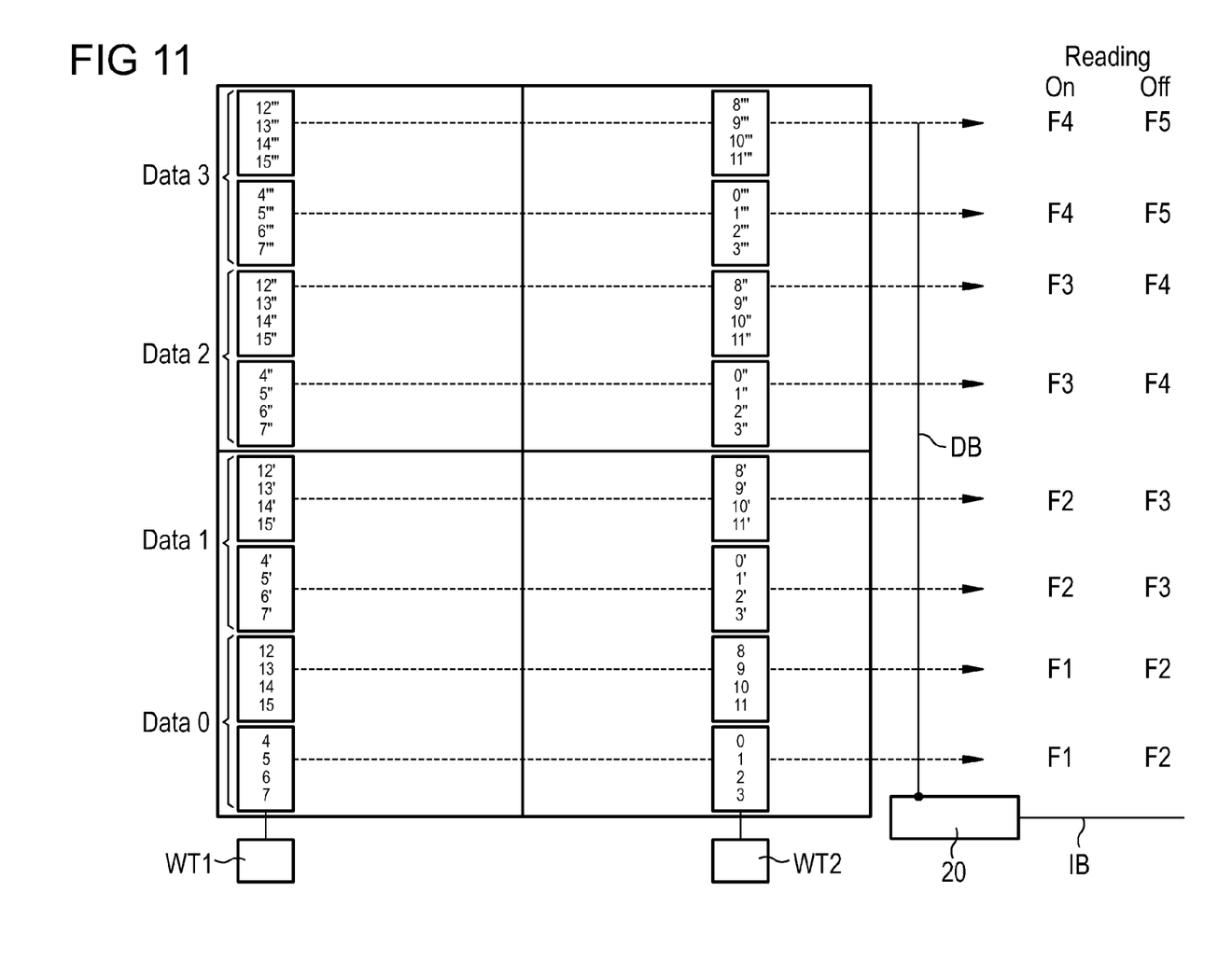
FIG. 11 shows read access to a memory cell array in an integrated circuit memory which is connected via a bus to a memory circuit for writing and reading data.

Read access to a memory cell array to which data have been written, as shown in FIG. 9, is illustrated using FIGS. 10 and 11. FIG. 10 shows a timing diagram for the data streams Data0, ..., Data3 when memory cells in the memory cell array 100 are read. An appropriate control potential on the word lines which are connected to the word line drivers WT1 or WT2 activates the memory cells connected to these word lines for a read operation, which means that they are conductively connected to the bit lines connected to them.

The short data path means that the data stream Data0 arrives on the memory circuit 20 first. Next, the data streams Data1, Data2 and Data3 arrive on the memory circuit 20. The data stream Data0 which arrived first is stored in the memory circuit 20 after a short setup time $t_{s0}$ actually upon the edge F1 of the clock signal CLK. The data stream Data0 is also output onto the bus IB first by the memory circuit 20 upon the edge F2 of the clock signal and supplied to the receiver circuits R0, ..., R15. Upon the edge F2, the data stream Data1 arriving on the memory circuit 20 next is buffer-stored in the memory circuit 20 and is output onto the bus IB upon the next edge F3 and supplied to the receiver circuits. The data stream Data2 is buffer-stored in the memory circuit 20 after a setup time $t_{s2}$ upon the edge F3 and is output onto the bus IB upon the edge F4. The data stream Data3, which is supplied to the memory circuit 20 from the most remote area of the memory cell array, is buffer-stored in the memory circuit 20 after a setup time $t_{s3}$ upon the edge F4 of the clock signal CLK and is output onto the bus IB upon the edge F5.

The embodiment of read access which is shown in FIGS. 10 and 11 also involves the data record applied to the memory circuit 20 first being stored in the memory circuit 20 first and also being output again first and supplied to the data connections. It is therefore no longer necessary for the data record which is applied to the memory circuit 20 first to be read into the memory circuit or output onto the data bus IB only when all the data in the memory cell array have arrived on the memory circuit 20. This means that it is possible to speed up the reading of data from the memory cell array and to reduce the latency for the reading in this case too.

Figure 12:
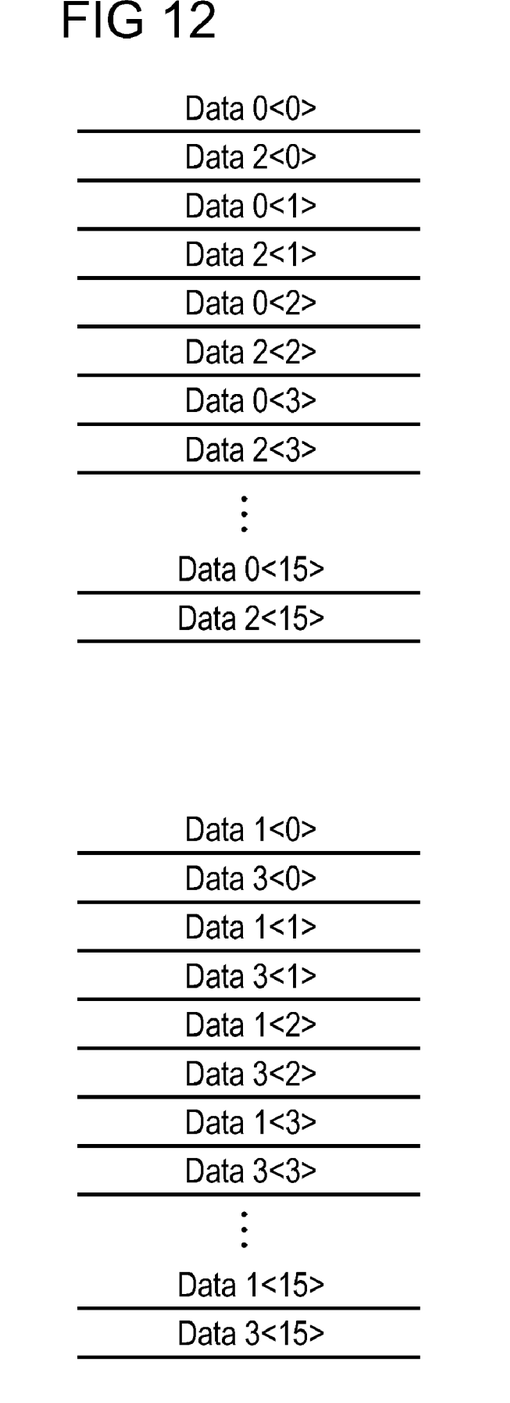
FIG. 12 shows a data bus with a plurality of lines.

FIG. 12 shows an embodiment of the data bus DB. In this embodiment, lines L0 which transmit data in the data stream Data0 and lines L2 which transmit data in the data stream Data2, and also lines L1 and L3 which transmit data in the data stream Data1 and Data3, are arranged physically adjacent. Since lines arranged next to one another carry data signals for data which have been output onto the bus DB by the memory circuit 20 upon different edges of the clock signal CLK, disruption of signals on the bus lines is largely avoided.

While specific embodiments have been described in detail in the foregoing detailed description and illustrated in the accompanying drawings, those with ordinary skill in the art will appreciate that various modifications and alternatives to those details could be developed in the light of the overall teachings of the disclosure. Accordingly, the particular arrangements disclosed are meant to be illustrative only and not limiting as to the scope of the invention, which is to be given the full breadth of the appended claims and any and all equivalents thereof.

What is claimed is:

1. An integrated circuit memory with clock-controlled memory access, comprising:
   at least one data connection to input/output data;
   a memory cell array comprising memory cells to store data;
   a clock generator circuit to generate a clock signal;
   a memory circuit to store a data item, the memory circuit being connected to the memory cell array and to the at least one data connection; and
   a control circuit to control storage of data in the memory circuit and to control output of data from the memory circuit;
      the control circuit, in the event of a write access to the memory cells in the memory cell array, being operable to actuate the memory circuit such that:
         in response to a first edge of the clock signal, a first data supplied to the memory circuit from the at least one data connection is buffer-stored in the memory circuit;
         in response to a second edge of the clock signal, a second data subsequently supplied to the memory circuit from the at least one data connection is buffer-stored in the memory circuit, the second edge of the clock signal occurring after the first edge occurs; and
         in response to a common edge of the clock signal, the buffer-stored first and second data are output from the memory circuit and supplied to the memory cell array;
      wherein memory cells of the memory cell array that are arranged close to an associated word line driver are turned off first at the end of a write operation.

2. The integrated circuit memory according to claim 1, wherein the control circuit, in the event of a read access to the memory cells in the memory cell array, is operable to actuate the memory circuit such that:
   in response to a first edge of the clock signal, a first data supplied to the memory circuit from the memory cell array is buffer-stored in the memory circuit;
   in response to a second edge of the clock signal, a second data subsequently supplied to the memory circuit from the memory cell array is buffer-stored in the memory circuit, the second edge of the clock signal occurring after the first edge occurs;

in response to one of: the first edge or a third edge of the clock signal, the buffer-stored first data is output from the memory circuit and supplied to the at least one data connection, the third edge of the clock signal occurring after the first edge occurs; and in response to a fourth edge of the clock signal, the buffer-stored second data is output from the memory circuit and supplied to the at least one data connection, the fourth edge of the clock signal occurring after the first data is output from the memory circuit.

3. The integrated circuit memory according to claim 1, wherein the memory cell array further comprises:
a first part of the memory cells being arranged in a first area of the memory cell array; and
a second part of the memory cells being arranged in a second area of the memory cell array;
wherein the first area is disposed closer to the memory circuit than the second area.

4. The integrated circuit memory according to claim 3, wherein, in the event of a write access to the memory cells in the memory cell array:
the first data is stored in the first part of the memory cells; and
the second data is stored in the second part of the memory cells.

5. The integrated circuit memory according to claim 3, wherein, in the event of a write access to the memory cells in the memory cell array:
the first data is stored in the second part of the memory cells; and
the second data is stored in the first part of the memory cells.

6. The integrated circuit memory according to claim 3, wherein, in the event of a read access to the memory cells in the memory cell array:
the first data is read from the first part of the memory cells; and
the second data is read from the second part of the memory cells.

7. The integrated circuit memory according to claim 1, further comprising:
a first bus connecting the memory circuit to the memory cell array, the first bus including a plurality of lines; and
a second bus connecting the memory circuit to the data connections of the integrated circuit memory, the second bus including a plurality of lines;
wherein the first bus comprises a greater number of lines than the second bus.

8. The integrated circuit memory according to claim 7, wherein the plurality of second bus lines is arranged such that adjacent lines carry data signals for data output by the memory circuit to the first bus in response to different edges of the clock signal.

9. The integrated circuit memory according to claim 7, wherein the plurality of first bus lines is arranged such that adjacent lines carry data signals for data output by the memory circuit to the second bus in response to different edges of the clock signal.

10. The integrated circuit memory according to claim 7, further comprising:
a plurality of receiver circuits respectfully connected to the data connections, wherein each of the receiver circuits is connected to the memory circuit via the second bus.

11. The integrated circuit memory according to claim 7, wherein the memory cells are dynamic random access memory cells.

12. The integrated circuit memory according to claim 7, wherein the first bus is a 64-bit bus.

13. The integrated circuit memory according to claim 7, wherein the second bus is one of: a 4-bit bus, a 8-bit bus and a 16-bit bus.

14. A method to operate an integrated circuit memory, the method comprising:
providing an integrated circuit memory including: at least one data connection to input/output data, a memory cell array with memory cells to store data and a memory circuit to store data;
applying a first data to the at least one data connection;
subsequently applying a second data to the at least one data connection;
supplying the first and subsequently the second data to the memory circuit;
storing the first data in the memory circuit in response to a first edge of a clock signal;
storing the second data in the memory circuit in response to a second edge of the clock signal, the second edge occurring after the first edge;
outputting the first and second data from the memory circuit in response to a common edge of the clock signal to store the first and second data in the memory cells of the memory cell array;
wherein memory cells of the memory cell array that are arranged close to an associated word line driver are turned off first at the end of a write operation.

15. The method according to claim 14, further comprising:
reading the first data from one of the memory cells in the memory cell array and supplying the first data to the memory circuit,
subsequently reading the second data from one of the memory cells in the memory cell array and supplying the second data to the memory circuit,
storing the first data in the memory circuit in response to the first edge of the clock signal;
storing the second data in the memory circuit in response to the second edge of the clock signal, the second edge occurring after the first edge;
outputting the first data from the memory circuit in response to one of: the first edge of the clock signal or a third edge, the third edge occurring after the first edge;
supplying the first data to the at least one data connection, thereby reading the first data from one of the memory cells in the memory cell array;
outputting the second data from the memory circuit in response to the fourth edge of the clock signal, the fourth edge occurring after the first data is output from the memory circuit,
supplying the second data to the at least one data connection, thereby reading the second data from a second one of the memory cells in the memory cell array.

16. The method according to claim 14, wherein, in the event of writing to the memory cells in the memory cell array, the method comprises:
writing the first data to a first part of the memory cells; and
writing the second data to a second part of the memory cells;
wherein the first part of the memory cells is arranged in a first area of the memory cell array and the second part of the memory cells is arranged in a second area of the memory cell array, the first area being disposed closer to the memory circuit than the second area.

17. The method according to claim 14, wherein, in the event of writing to the memory cells in the memory cell array, the method comprises:

writing the first data to a second part of the memory cells; and writing the second data to a first part of the memory cells;

wherein the first part of the memory cells is arranged in a first area of the memory cell array and the second part of the memory cells is arranged in a second area of the memory cell array, the first area being disposed closer to the memory circuit than the second area.

18. The method according to claim 14, wherein, in the event of reading from the memory cells in the memory cell array, the method comprises:

reading the first data from the first part of the memory cells; and reading the second data from the second part of the memory cells.

* * * * *